US009318171B2

(12) United States Patent
Van Huben et al.

(10) Patent No.: US 9,318,171 B2
(45) Date of Patent: *Apr. 19, 2016

(54) DUAL ASYNCHRONOUS AND SYNCHRONOUS MEMORY SYSTEM

(71) Applicant: International Business Machines Corporation, Armonk, NY (US)

(72) Inventors: Gary A. Van Huben, Poughkeepsie, NY (US); Patrick J. Meaney, Poughkeepsie, NY (US); John S. Dodson, Austin, TX (US); Scot H. Rider, Pleasant Valley, NY (US); James C. Gregerson, Hyde Park, NY (US); Eric E. Retter, Austin, TX (US); Irving G. Baysah, Hutto, TX (US); Glenn D. Gilda, Binghamton, NY (US); Lawrence D. Curley, Endwell, NY (US); Vesselina K. Papazova, Highland, NY (US)

(73) Assignee: International Business Machines Corporation, Armonk, NY (US)

( * ) Notice: Subject to any disclaimer, the term of this patent is extended or adjusted under 35 U.S.C. 154(b) by 56 days.

This patent is subject to a terminal disclaimer.

(21) Appl. No.: 14/501,107

(22) Filed: Sep. 30, 2014

(65) Prior Publication Data

US 2015/0019831 A1      Jan. 15, 2015

Related U.S. Application Data

(63) Continuation of application No. 13/835,521, filed on Mar. 15, 2013, now Pat. No. 9,142,272.

(51) Int. Cl.
*G06F 13/00* (2006.01)
*G06F 13/28* (2006.01)
(Continued)

(52) U.S. Cl.
CPC ............ *G11C 7/222* (2013.01); *G06F 13/1673* (2013.01); *G06F 13/42* (2013.01); *G11C 5/04* (2013.01); *G11C 7/225* (2013.01); *G11C 11/4076* (2013.01)

(58) Field of Classification Search
None
See application file for complete search history.

(56) References Cited

U.S. PATENT DOCUMENTS

| 5,201,041 A | 4/1993 | Bohner et al. |
| 5,544,339 A | 8/1996 | Baba |

(Continued)

FOREIGN PATENT DOCUMENTS

| WO | WO2011160923 | 12/2011 |
| WO | WO2012089507 | 7/2012 |

OTHER PUBLICATIONS

G.A. VanHuben et al., Server-class DDR3 SDRAM memory buffer chip, IBM Journal of Research and Development, vol. 56, Issue 1.2, Jan. 2012, pp. 3:1-3:11.

(Continued)

*Primary Examiner* — Brian Peugh
*Assistant Examiner* — Dustin Bone
(74) *Attorney, Agent, or Firm* — Cantor Colburn LLP; Margaret McNamara

(57) ABSTRACT

A computer-system implemented method for dual asynchronous and synchronous memory operation in a memory subsystem includes establishing a synchronous channel between a memory controller and a memory buffer chip. A mode selector determines a reference clock source for a memory domain phase-locked loop of the memory buffer chip based on an operating mode of the memory buffer chip. An output of a nest domain phase-locked loop is provided as the reference clock source to the memory domain phase-locked loop in the memory buffer chip based on the operating mode being synchronous. The nest domain phase-locked loop is operable synchronous to a memory controller phase-locked loop of the memory controller. A separate reference clock is provided independent of the nest domain phase-locked loop as the reference clock to the memory domain phase-locked loop based on the operating mode being asynchronous.

12 Claims, 9 Drawing Sheets

(51) Int. Cl.
    *G11C 7/22*     (2006.01)
    *G06F 13/42*     (2006.01)
    *G11C 5/04*     (2006.01)
    *G06F 13/16*     (2006.01)
    G11C 11/4076     (2006.01)

(56) References Cited

U.S. PATENT DOCUMENTS

| | | |
|---|---|---|
| 5,555,420 A | 9/1996 | Sarangdhar et al. |
| 5,794,019 A | 8/1998 | Genduso et al. |
| 5,918,242 A | 6/1999 | Sarma et al. |
| 6,098,134 A | 8/2000 | Michels et al. |
| 6,215,782 B1 | 4/2001 | Buskens et al. |
| 6,338,126 B1 | 1/2002 | Ohran et al. |
| 6,430,696 B1 | 8/2002 | Keeth |
| 6,519,688 B1 | 2/2003 | Lu et al. |
| 6,771,670 B1 | 8/2004 | Pfahler et al. |
| 7,149,828 B2 | 12/2006 | Hayashi et al. |
| 7,730,202 B1 | 6/2010 | Biederman et al. |
| 2002/0120890 A1 | 8/2002 | Calvignac et al. |
| 2003/0133452 A1 | 7/2003 | Su |
| 2005/0160315 A1 | 7/2005 | Chandrasekaran et al. |
| 2005/0228947 A1 | 10/2005 | Morita et al. |
| 2005/0235072 A1 | 10/2005 | Smith et al. |
| 2006/0236008 A1 | 10/2006 | Asano et al. |
| 2007/0174529 A1 | 7/2007 | Rodriguez et al. |
| 2007/0276976 A1 | 11/2007 | Gower et al. |
| 2008/0155204 A1 | 6/2008 | Qawami et al. |
| 2009/0043965 A1 | 2/2009 | Kuttanna et al. |
| 2009/0138782 A1 | 5/2009 | Ambilkar et al. |
| 2009/0210729 A1 | 8/2009 | Adams et al. |
| 2010/0088483 A1 | 4/2010 | Lovett |
| 2010/0262751 A1 | 10/2010 | Avudaiyappan |
| 2011/0110165 A1 | 5/2011 | Gillingham et al. |
| 2011/0116337 A1 | 5/2011 | Hay et al. |
| 2011/0131346 A1 | 6/2011 | Noeldner et al. |
| 2011/0167292 A1 | 7/2011 | Bohno |
| 2011/0252193 A1 | 10/2011 | Bains et al. |
| 2011/0258400 A1 | 10/2011 | Warnes et al. |
| 2011/0320864 A1 | 12/2011 | Gower et al. |
| 2011/0320869 A1 | 12/2011 | Gower et al. |
| 2011/0320914 A1 | 12/2011 | Alves et al. |
| 2011/0320918 A1 | 12/2011 | Alves et al. |
| 2012/0054518 A1 | 3/2012 | Sadowski et al. |
| 2012/0096301 A1 | 4/2012 | Khodabandehlou et al. |
| 2012/0166894 A1 | 6/2012 | Jang |
| 2012/0173936 A1 | 7/2012 | Johnson et al. |
| 2012/0198309 A1 | 8/2012 | Alves et al. |
| 2012/0284576 A1 | 11/2012 | Housty et al. |
| 2012/0314517 A1 | 12/2012 | Nobunaga et al. |
| 2013/0054840 A1 | 2/2013 | Sarcone et al. |
| 2013/0104001 A1 | 4/2013 | Nakanishi et al. |
| 2014/0244920 A1 | 8/2014 | Biswas et al. |
| 2014/0281325 A1 | 9/2014 | Meaney et al. |

OTHER PUBLICATIONS

P.J. Meaney, et al., IBM zEnterprise redundant array of independent memory subsystem, IBM Journal of Research and Development, vol. 56, Issue 1.2, Jan. 2012, pp. 4:1-4:11.
U.S. Appl. No. 13/834,959 Notice of Allowance dated Dec. 2, 2014, 24 pages.
U.S. Appl. No. 13/835,521 Non-Final Office Action dated Nov. 20, 2014, 47 pages.
Notice of Allowance for U.S. Appl. No. 13/835,205, filed Mar. 15, 2013; date mailed May 9, 2014; 21 pages.
U.S. Appl. No. 13/835,444 Notice of Allowance dated Oct. 1, 2014, 17 pages.
U.S. Appl. No. 13/835,521 Notice of Allowance dated May 13, 2015, 13 pages.

DUAL ASYNCHRONOUS AND SYNCHRONOUS MEMORY SYSTEM

DOMESTIC PRIORITY

This application is a continuation of U.S. application Ser. No. 13/835,521 filed Mar. 15, 2013, now U. S. Pat. No. 9,142,272, the disclosure of which is incorporated by reference herein in its entirety.

BACKGROUND

The present invention relates generally to computer memory, and more specifically, to a dual asynchronous and synchronous memory system.

Contemporary high performance computing main memory systems are generally composed of one or more memory devices, which are connected to one or more memory controllers and/or processors via one or more memory interface elements such as buffers, hubs, bus-to-bus converters, etc. The memory devices are generally located on a memory subsystem such as a memory card or memory module and are often connected via a pluggable interconnection system (e.g., one or more connectors) to a system board (e.g., a PC motherboard).

Overall computer system performance is affected by each of the key elements of the computer structure, including the performance/structure of the processor(s), any memory cache(s), the input/output (I/O) subsystem(s), the efficiency of the memory control function(s), the performance of the main memory devices(s) and any associated memory interface elements, and the type and structure of the memory interconnect interface(s).

Extensive research and development efforts are invested by the industry, on an ongoing basis, to create improved and/or innovative solutions to maximizing overall system performance and density by improving the memory system/subsystem design and/or structure. High-availability systems present further challenges as related to overall system reliability due to customer expectations that new computer systems will markedly surpass existing systems in regard to mean-time-between-failure (MTBF), in addition to offering additional functions, increased performance, increased storage, lower operating costs, etc. Other frequent customer requirements further exacerbate the memory system design challenges, and include such items as ease of upgrade and reduced system environmental impact (such as space, power and cooling). In addition, customers are requiring the ability to access an increasing number of higher density memory devices (e.g., DDR3 and DDR4 SDRAMs) at faster and faster access speeds.

In view of varying cost, capacity, and scalability requirements, a wide number of memory system options may need to be considered. Often a choice needs to be made between using an asynchronous boundary between a processor and memory buffer chips or designing a fully synchronous system. An asynchronous design allows the flexibility of running the processor at a fixed frequency, while memory buffer chips can be programmed to varying frequencies to match the desired memory components. For example, if cost is most important, a slower more widely available dual in-line memory module (DIMM) can be used. In contrast, if performance is paramount, then a leading edge technology DIMM can be used. This type of memory system architecture may work well in systems where each memory channel runs independently. However, this approach typically falls short in high-availability systems.

Redundant array of independent memory (RAIM) systems have been developed to improve performance and/or to increase the availability of storage systems. RAIM distributes data across several independent memory modules, where each memory module contains one or more memory devices. There are many different RAIM schemes that have been developed, each having different characteristics, and different pros and cons associated with them. Performance, availability, and utilization/efficiency (e.g., the percentage of the memory devices that actually hold customer data) are perhaps the most important. The tradeoffs associated with various schemes have to be carefully considered because improvements in one attribute can often result in reductions in another. Examples of RAIM systems may be found, for instance, in U.S. Patent Publication No. 2011/0320918 titled "RAIM System Using Decoding of Virtual ECC", filed on Jun. 24, 2010, the contents of which are hereby incorporated by reference in its entirety, and in U.S. Patent Publication Number 2011/0320914 titled "Error Correction and Detection in a Redundant Memory System", filed on Jun. 24, 2010, the contents of which are hereby incorporated by reference in its entirety.

High availability systems, such as RAIM systems, can include a number of clock domains in various subsystems. Efficient integration of subsystems including different clock domains presents a number of challenges to establish synchronization timing, detection of synchronization issues, and recovery of synchronization.

SUMMARY

A computer-system implemented method for dual asynchronous and synchronous memory operation in a memory subsystem includes establishing a synchronous channel between a memory controller and a memory buffer chip. A mode selector determines a reference clock source for a memory domain phase-locked loop of the memory buffer chip based on an operating mode of the memory buffer chip. An output of a nest domain phase-locked loop is provided as the reference clock source to the memory domain phase-locked loop in the memory buffer chip based on the operating mode being synchronous. The nest domain phase-locked loop is operable synchronous to a memory controller phase-locked loop of the memory controller. A separate reference clock is provided independent of the nest domain phase-locked loop as the reference clock to the memory domain phase-locked loop based on the operating mode being asynchronous.

A computer program product for synchronizing a dual asynchronous and synchronous memory subsystem is provided. The computer program product includes a tangible storage medium readable by a processing circuit and storing instructions for execution by the processing circuit for performing a method. The method includes initializing and calibrating lanes of a synchronous channel by a memory controller coupled to a memory buffer chip via the synchronous channel. A frame round trip latency is calculated for the synchronous channel by the memory controller. A frame transmission protocol is established based on the calculated frame round trip latency. A synchronization reference is established for the memory buffer chip by the memory controller. The memory buffer chip includes a synchronous operating mode and an asynchronous operating mode relative to the memory controller.

BRIEF DESCRIPTION OF THE SEVERAL VIEWS OF THE DRAWINGS

The subject matter which is regarded as embodiments is particularly pointed out and distinctly claimed in the claims at the conclusion of the specification. The forgoing and other features, and advantages of the embodiments are apparent from the following detailed description taken in conjunction with the accompanying drawings in which:

DETAILED DESCRIPTION

Exemplary embodiments provide a memory system that includes a configurable memory subsystem which can run in either an asynchronous or fully synchronous operational mode. The memory system includes a processing subsystem that communicates synchronously with the memory subsystem in a nest domain. The memory subsystem also includes a memory domain that can be run synchronously or asynchronously relative to the nest domain.

Figure 1:
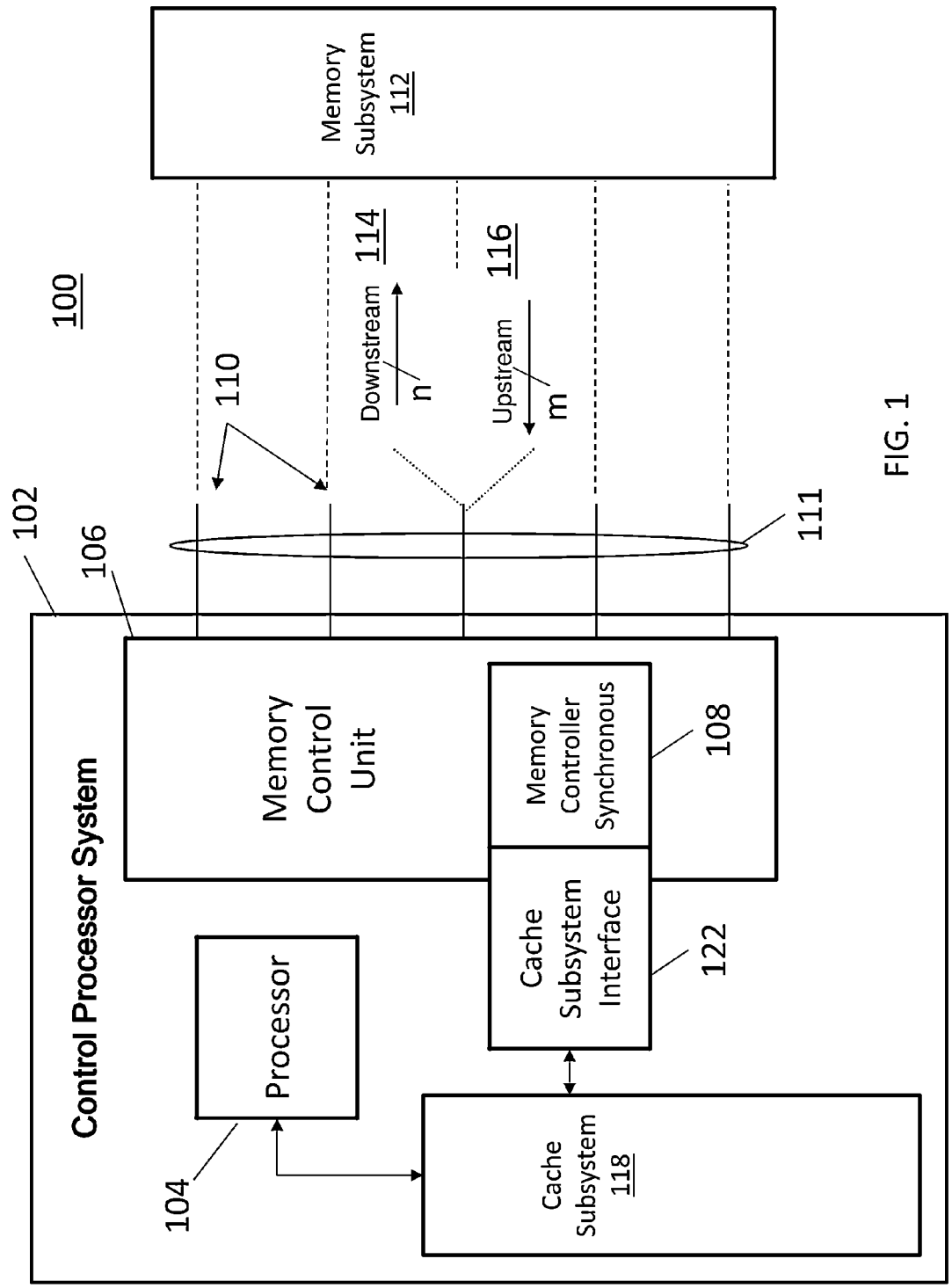
FIG. 1 depicts a memory system in accordance with an embodiment.

FIG. 1 depicts an example memory system 100 which may be part of a larger computer system structure. A control processor (CP) system 102 is a processing subsystem that includes at least one processor 104 configured to interface with a memory control unit (MCU) 106. The processor 104 can be a multi-core processor or module that processes read, write, and configuration requests from a system controller (not depicted). The MCU 106 includes a memory controller synchronous (MCS) 108, also referred to as a memory controller, that controls communication with a number of channels 110 for accessing a plurality of memory devices in a memory subsystem 112. The MCU 106 and the MCS 108 may include one or more processing circuits, or processing may be performed by or in conjunction with the processor 104. In the example of FIG. 1, there are five channels 110 that can support parallel memory accesses as a virtual channel 111. In an embodiment, the memory system 100 is a five-channel redundant array of independent memory (RAIM) system, where four of the channels 110 provide access to columns of data and check-bit memory, and a fifth channel provides access to RAIM parity bits in the memory subsystem 112.

Each of the channels 110 is a synchronous channel which includes a downstream bus 114 and an upstream bus 116. Each downstream bus 114 of a given channel 110 may include a different number of lanes or links than a corresponding upstream bus 116. In the example of FIG. 1, each downstream bus 114 includes n-unidirectional high-speed serial lanes and each upstream bus 116 includes m-unidirectional high-speed serial lanes. Frames of commands and/or data can be transmitted and received on each of the channels 110 as packets that are decomposed into individual lanes for serial communication. In an embodiment, packets are transmitted at about 9.6 gigabits per second (Gbps), and each transmitting lane transmits four-bit groups serially per channel 110. The memory subsystem 112 receives, de-skews, and de-serializes each four-bit group per lane of the downstream bus 114 to reconstruct a frame per channel 110 from the MCU 106. Likewise, the memory subsystem 112 can transmit to the MCU 106 a frame of packets as four-bit groups per lane of the upstream bus 116 per channel 110. Each frame can include one or more packets, also referred to as transmission packets.

The CP system 102 may also include a cache subsystem 118 that interfaces with the processor 104. A cache subsystem interface 122 of the CP system 102 provides a communication interface to the cache subsystem 118. The cache subsystem interface 122 may receive data from the memory subsystem 112 via the MCU 106 to store in the cache subsystem 118.

Figure 2:
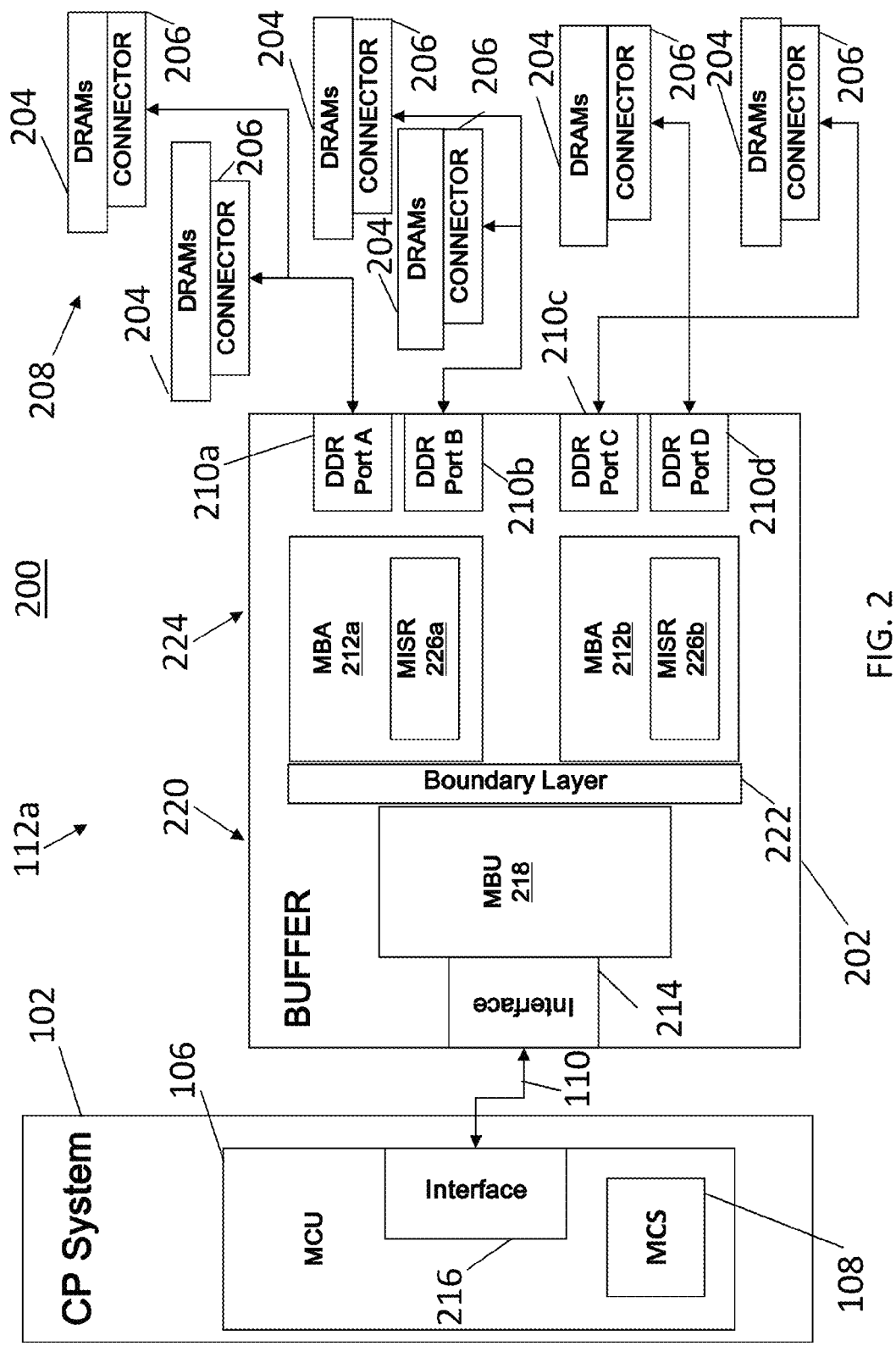
FIG. 2 depicts a memory subsystem in a planar configuration in accordance with an embodiment.

FIG. 2 depicts an example of a memory subsystem 112a as an instance of the memory subsystem 112 of FIG. 1 in a planar configuration 200 in accordance with an embodiment. The example of FIG. 2 only depicts one channel 110 of the memory subsystem 112a; however, it will be understood that the memory subsystem 112a can include multiple instances of the planar configuration 200 as depicted in FIG. 2, e.g., five instances. As illustrated in FIG. 2, the planar configuration 200 includes a memory buffer chip 202 connected to a plurality of dynamic random access memory (DRAM) devices 204 via connectors 206. The DRAM devices 204 may be organized as ranks of one or more dual in-line memory modules (DIMMs) 208. The each of the connectors 206 is coupled to a double data rate (DDR) port 210, also referred to as a memory interface port 210 of the memory buffer chip 202, where each DDR port 210 can be coupled to more than one connector 206. In the example of FIG. 2, the memory buffer chip 202 includes DDR ports 210a, 210b, 210c, and 210d. The DDR ports 210a and 210b are each coupled to a pair of connectors 206 and a shared memory buffer adaptor (MBA) 212a. The DDR ports 210c and 210d may each be coupled to a single connector 206 and a shared memory buffer adaptor (MBA) 212b. The DDR ports 210a-210d are JEDEC-compliant memory interfaces for issuing memory commands and reading and writing memory data to the DRAM devices 204.

The MBAs 212a and 212b include memory control logic for managing accesses to the DRAM devices 204, as well as controlling timing, refresh, calibration, and the like. The MBAs 212a and 212b can be operated in parallel, such that an operation on DDR port 210a or 210b can be performed in parallel with an operation on DDR port 210c or 210d.

The memory buffer chip 202 also includes an interface 214 configured to communicate with a corresponding interface 216 of the MCU 106 via the channel 110. Synchronous communication is established between the interfaces 214 and 216. As such, a portion of the memory buffer chip 202 including a memory buffer unit (MBU) 218 operates in a nest domain 220 which is synchronous with the MCS 108 of the CP system 102. A boundary layer 222 divides the nest domain 220 from a memory domain 224. The MBAs 212a and 212b and the DDR ports 210a-210d, as well as the DRAM devices 204 are in the memory domain 224. A timing relationship between the nest domain 220 and the memory domain 224 is configurable, such that the memory domain 224 can operate asynchronously relative to the nest domain 220, or the memory domain 224 can operate synchronously relative to the nest domain 220. The boundary layer 222 is configurable to operate in a synchronous transfer mode and an asynchronous transfer mode between the nest and memory domains 220, 224. The memory buffer chip 202 may also include one or more multiple-input shift-registers (MISRs) 226, as further described herein. For example, the MBA 212a can include one or more MISR 226a, and the MBA 212b can include one or more MISR 226b. Other instances of MISRs 226 can be included elsewhere within the memory system 100. As a further example, one or more MISRs 226 can be positioned individually or in a hierarchy that spans the MBU 218 and MBAs 212a and 212b and/or in the MCU 106.

The boundary layer 222 is an asynchronous interface that permits different DIMMs 208 or DRAM devices 204 of varying frequencies to be installed into the memory domain 224 without the need to alter the frequency of the nest domain 220. This allows the CP system 102 to remain intact during memory installs or upgrades, thereby permitting greater flexibility in custom configurations. In the asynchronous transfer mode, a handshake protocol can be used to pass commands and data across the boundary layer 222 between the nest and memory domains 220, 224. In the synchronous transfer mode, timing of the memory domain 224 is phase adjusted to align with the nest domain 220 such that a periodic alignment of the nest and memory domains 220, 224 occurs at an alignment cycle in which commands and data can cross the boundary layer 222.

The nest domain 220 is mainly responsible for reconstructing and decoding the source synchronous channel packets, applying any necessary addressing translations, performing coherency actions, such as directory look-ups and cache accesses, and dispatching memory operations to the memory domain 224. The memory domain 224 may include queues, a scheduler, dynamic power management controls, hardware engines for calibrating the DDR ports 210a-210d, and maintenance, diagnostic, and test engines for discovery and management of correctable and uncorrectable errors. There may be other functions in the nest or memory domain. For instance, there may be a cache of embedded DRAM (eDRAM) memory with a corresponding directory. If the cache is created for some applications and other instances do not use it, there may be power savings by connecting a special array voltage (e.g., VCS) to ground. These functions may be incorporated within the MBU 218 or located elsewhere within the nest domain 220. The MBAs 212a and 212b within the memory domain 224 may also include logic to initiate autonomic memory operations for the DRAM devices 204, such as refresh and periodic calibration sequences in order to maintain proper data and signal integrity.

Figure 3:
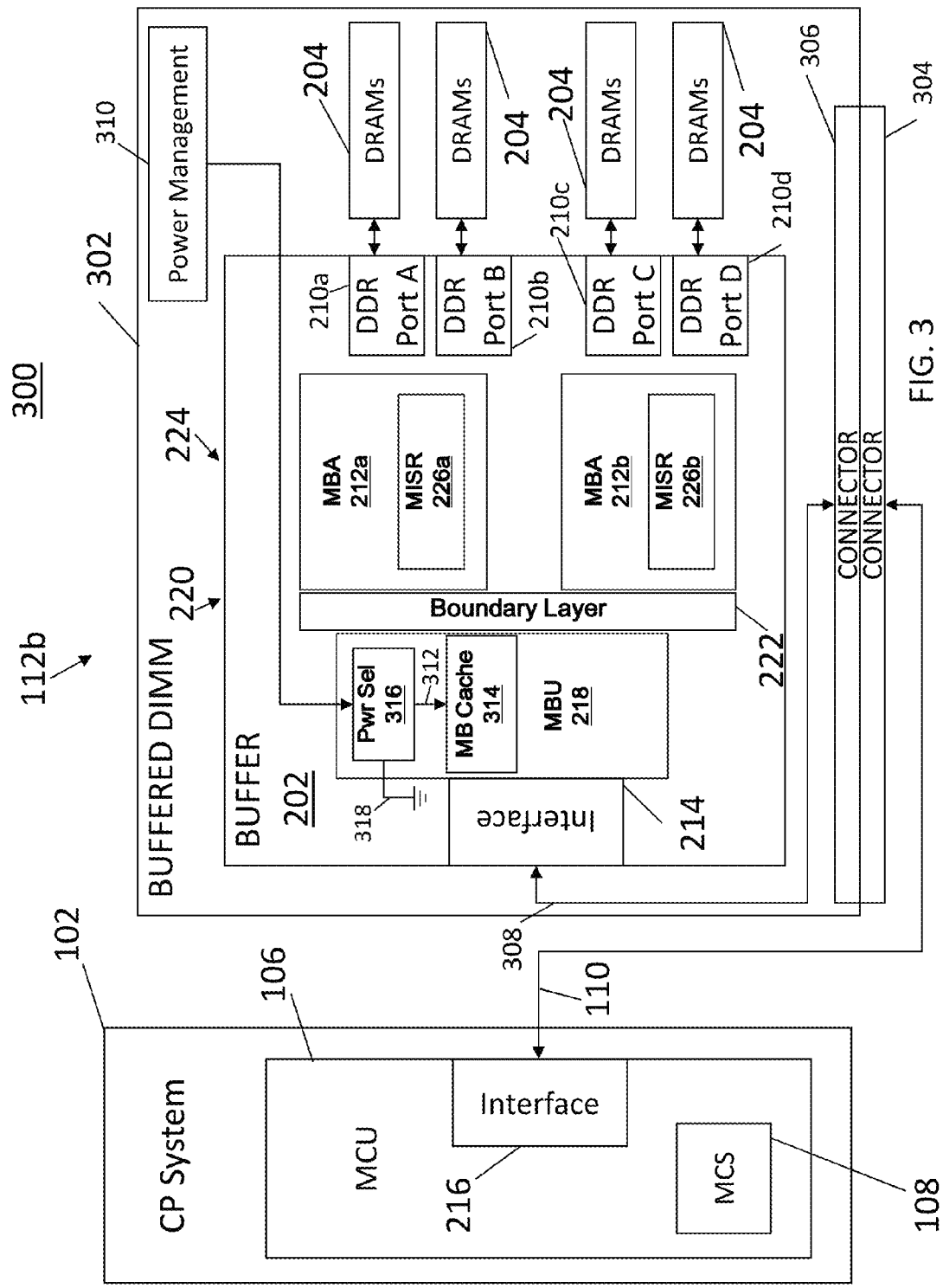
FIG. 3 depicts a memory subsystem in a buffered DIMM configuration in accordance with an embodiment.

FIG. 3 depicts a memory subsystem 112b as an instance of the memory subsystem 112 of FIG. 1 in a buffered DIMM configuration 300 in accordance with an embodiment. The buffered DIMM configuration 300 can include multiple buffered DIMMs 302 within the memory subsystem 112b, e.g., five or more instances of the buffered DIMM 302, where a single buffered DIMM 302 is depicted in FIG. 3 for purposes of explanation. The buffered DIMM 302 includes the memory buffer chip 202 of FIG. 2. As in the example of FIG. 2, the MCS 108 of the MCU 106 in the CP system 102 communicates synchronously on channel 110 via the interface 216. In the example of FIG. 3, the channel 110 interfaces to a connecter 304, e.g., a socket, that is coupled to a connector 306 of the buffered DIMM 302. A signal path 308 between the connector 306 and the interface 214 of the memory buffer chip 202 enables synchronous communication between the interfaces 214 and 216.

As in the example of FIG. 2, the memory buffer chip 202 as depicted in FIG. 3 includes the nest domain 220 and the memory domain 224. Similar to FIG. 2, the memory buffer chip 202 may include one or more MISRs 226, such as one or more MISR 226a in MBA 212a and one or more MISR 226b in MBA 212b. In the example of FIG. 3, the MBU 218 passes commands across the boundary layer 222 from the nest domain 220 to the MBA 212a and/or to the MBA 212b in the memory domain 224. The MBA 212a interfaces with DDR ports 210a and 210b, and the MBA 212b interfaces with DDR ports 210c and 210d. Rather than interfacing with DRAM devices 204 on one or more DIMMs 208 as in the planar configuration 200 of FIG. 2, the DDR ports 210a-210d can interface directly with the DRAM devices 204 on the buffered DIMM 302.

The memory subsystem 112b may also include power management logic 310 that provides a voltage source for a voltage rail 312. The voltage rail 312 is a local cache voltage rail to power a memory buffer cache 314. The memory buffer cache 314 may be part of the MBU 218. A power selector 316 can be used to determine whether the voltage rail 312 is sourced by the power management logic 310 or tied to ground 318. The voltage rail 312 may be tied to ground 318 when the memory buffer cache 314 is not used, thereby reducing power consumption. When the memory buffer cache 314 is used, the power selector 316 ties the voltage rail 312 to a voltage supply of the power management logic 310. Fencing and clock gating can also be used to better isolate voltage and clock domains.

As can be seen in reference to FIGS. 2 and 3, a number of memory subsystem configurations can be supported in embodiments. Varying sizes and configurations of the DRAM devices 204 can have different address format requirements, as the number of ranks and the overall details of slots, rows, columns, banks, bank groups, and/or ports may vary across different DRAM devices 204 in embodiments. Various stacking architectures (for example, 3 die stacking, or 3DS) may also be implemented, which may include master ranks and slave ranks in the packaging architecture. Each of these different configurations of DRAM devices 204 may require a unique address mapping table. Therefore, generic bits may be used by the MCU 106 to reference particular bits in a DRAM device 204 without having full knowledge of the actual DRAM topology, thereby separating the physical implementation of the DRAM devices 204 from the MCU 106. The memory buffer chip 202 may map the generic bits to actual locations in the particular type(s) of DRAM that is attached to the memory buffer chip 202. The generic bits may be programmed to hold any appropriate address field, including but not limited to memory base address, rank (including master or slave), row, column, bank, bank group, and/or port, depending on the particular computer system.

Figure 4:
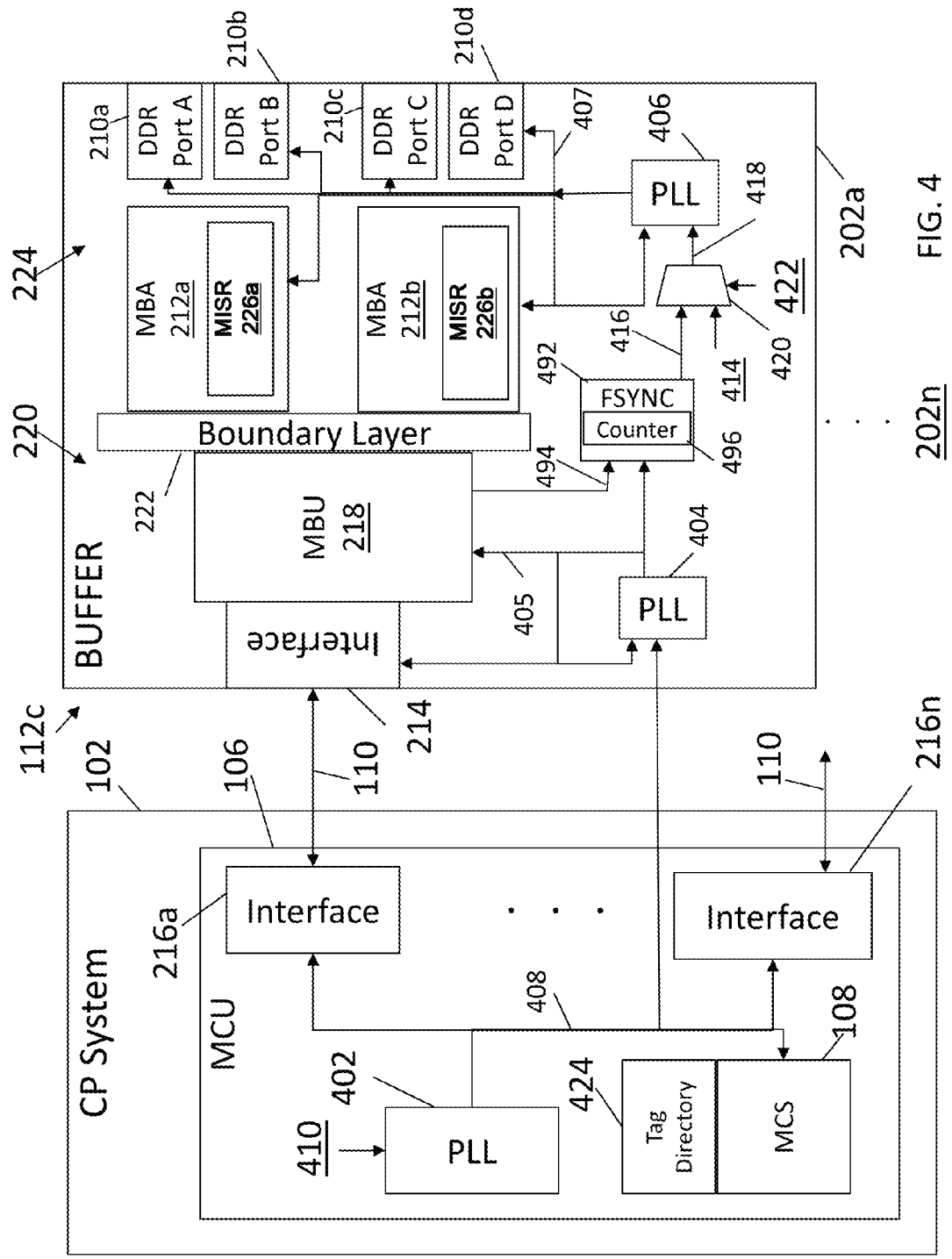
FIG. 4 depicts a memory subsystem with dual asynchronous and synchronous memory operation modes in accordance with an embodiment.

FIG. 4 depicts a memory subsystem 112c as an instance of the memory subsystem 112 of FIG. 1 with dual asynchronous and synchronous memory operation modes in accordance with an embodiment. The memory subsystem 112c can be implemented in the planar configuration 200 of FIG. 2 or in the buffered DIMM configuration 300 of FIG. 3. As in the examples of FIGS. 2 and 3, the MCS 108 of the MCU 106 in the CP system 102 communicates synchronously on channel 110 via the interface 216. FIG. 4 depicts multiple instances of the interface 216 as interfaces 216a-216n which are configured to communicate with multiple instances of the memory buffer chip 202a-202n. In an embodiment, there are five memory buffer chips 202a-202n per CP system 102.

As in the examples of FIGS. 2 and 3, the memory buffer chip 202a as depicted in FIG. 4 includes the nest domain 220 and the memory domain 224. Also similar to FIGS. 2 and 3, the memory buffer chip 202a may include one or more MISRs 226, such as one or more MISR 226a in MBA 212a and one or more MISR 226b in MBA 212b. In the example of FIG. 4, the MBU 218 passes commands across the boundary layer 222 from the nest domain 220 to the MBA 212a and/or to the MBA 212b in the memory domain 224. The MBA 212a interfaces with DDR ports 210a and 210b, and the MBA 212b interfaces with DDR ports 210c and 210d. The nest domain 220 and the memory domain 224 are established and maintained using phase-locked loops (PLLs) 402, 404, and 406.

The PLL 402 is a memory controller PLL configured to provide a master clock 408 to the MCS 108 and the interfaces 216a-216n in the MCU 106 of the CP system 102. The PLL 404 is a nest domain PLL that is coupled to the MBU 218 and the interface 214 of the memory buffer chip 202a to provide a plurality of nest domain clocks 405. The PLL 406 is a memory domain PLL coupled the MBAs 212a and 212b and to the DDR ports 210a-210d to provide a plurality of memory domain clocks 407. The PLL 402 is driven by a reference clock 410 to establish the master clock 408. The PLL 404 has a reference clock 408 for synchronizing to the master clock 405 in the nest domain 220. The PLL 406 can use a separate reference clock 414 or an output 416 of the PLL 404 to provide a reference clock 418. The separate reference clock 414 operates independent of the PLL 404.

A mode selector 420 determines the source of the reference clock 418 based on an operating mode 422 to enable the memory domain 224 to run either asynchronous or synchronous relative to the nest domain 220. When the operating mode 422 is an asynchronous operating mode, the reference clock 418 is based on the reference clock 414 as a reference clock source such that the PLL 406 is driven by separate reference clock and 414. When the operating mode 422 is a synchronous operating mode, the reference clock 418 is based on the output 416 of an FSYNC block 492 which employs PLL 404 as a reference clock source for synchronous clock alignment. This ensures that the PLLs 404 and 406 have related clock sources based on the reference clock 408. Even though the PLLs 404 and 406 can be synchronized in the synchronous operating mode, the PLLs 404 and 406 may be configured to operate at different frequencies relative to each other. Additional frequency multiples and derivatives, such as double rate, half rate, quarter rate, etc., can be generated based on each of the multiplier and divider settings in each of the PLLs 402, 404, and 406. For example, the nest domain clocks 405 can include multiples of a first frequency of the PLL 404, while the memory domain clocks 407 can include multiples of a second frequency of the PLL 406.

In an asynchronous mode of operation each memory buffer chip 202a-202n is assigned to an independent channel 110. All data for an individual cache line may be self-contained within the DRAM devices 204 of FIGS. 2 and 3 attached to a common memory buffer chip 202. This type of structure lends itself to lower-end cost effective systems which can scale the number of channels 110 as well as the DRAM speed and capacity as needs require. Additionally, this structure may be suitable in higher-end systems that employ features such as mirroring memory on dual channels 110 to provide high availability in the event of a channel outage.

When implemented as a RAIM system, the memory buffer chips 202a-202n can be configured in the synchronous mode of operation. In a RAIM configuration, memory data is striped across multiple physical memory channels 110, e.g., five channels 110, which can act as the single virtual channel 111 of FIG. 1 in order to provide error-correcting code (ECC) protection for continuous operation, even when an entire channel 110 fails. In a RAIM configuration, all of the memory buffer chips 202a-202n of the same virtual channel 111 are operated synchronously since each memory buffer chip 202 is responsible for a portion of a coherent line.

To support and maintain synchronous operation, the MCU 106 can detect situations where one channel 110 becomes temporarily or permanently incapacitated, thereby resulting in a situation wherein the channel 110 is operating out of sync with respect to the other channels 110. In many cases the underlying situation is recoverable, such as intermittent transmission errors on one of the interfaces 216a-216n and/or interface 214 of one of more of the memory buffer chips 202a-202n. Communication on the channels 110 may utilize a robust cyclic redundancy code (CRC) on transmissions, where a detected CRC error triggers a recovery retransmission sequence. There are cases where the retransmission requires some intervention or delay between the detection and retransmission. A replay system including replay buffers for each of the channels can be used to support a recovery retransmission sequence for a faulty channel 110. Portions of the replay system may be suspended for a programmable period of time to ensure that source data to be stored in the replay buffer has been stored prior to initiating automated recovery. The period of time while replay is suspended can also be used to make adjustments to other subsystems, such as voltage controls, clocks, tuning logic, power controls, and the like, which may assist in preventing a recurrence of an error condition that led to the fault. Suspending replay may also remove the need for the MCU 106 to reissue a remaining portion of a store on the failing channel 110 and may increase the potential of success upon the replay.

Although the recovery retransmission sequence can eventually restore a faulty channel 110 to fully operational status, the overall memory subsystem 112 remains available during a recovery period. Tolerating a temporary out of sync condition allows memory operations to continue by using the remaining good (i.e., non-faulty) channels 110 until the recovery sequence is complete. For instance, if data has already started to transfer back to the cache subsystem 118 of FIG. 1, there may need to be a way to process failing data after it has been transmitted. While returning data with gaps is one option, another option is to delay the start of data transmission until all error status is known. Delaying may lead to reduced performance when there is a gapless requirement. After recovering a faulty channel 110, the MCU 106 resynchronizes the recovered channel 110 to the remaining good channels 110 thereby re-establishing a fully functional interface across all channels 110 of the virtual channel 111 of FIG. 1.

To support timing alignment issues that may otherwise be handled using deskewing logic, the MCU 106 and the memory buffer chip 202 may support the use of tags. Command completion and data destination routing information can be stored in a tag directory 424 which is accessed using a received tag. Mechanisms for error recovery, including retrying of read or write commands, may be implemented in the memory buffer chips 202 for each individual channel 110. Each command that is issued by the MCU 106 to the memory buffer chips 202 may be assigned a command tag in the MCU 106, and the assigned command tag sent with the command to the memory buffer chips 202 in the various channels 110. The various channels 110 send back response tags that comprise data tags or done tags. Data tags corresponding to the assigned command tag are returned from the buffer chip in each channel to correlate read data that is returned from the various channels 110 to an original read command. Done tags corresponding to the assigned command tag are also returned from the memory buffer chip 202 in each channel 110 to indicate read or write command completion.

The tag directory 424, also associated with tag tables which can include a data tag table and a done tag table, may be maintained in the MCU 106 to record and check the returned data and done tags. It is determined based on the tag tables when all of the currently functioning channels in communication with the MCU 106 return the tags corresponding to a particular command. For data tags corresponding to a read command, the read data is considered available for delivery to the cache subsystem 118 of FIG. 1 when a data tag corresponding to the read command is determined to have been received from each of the currently functioning channels 110. For done tags corresponding to a read or write command, the read or write is indicated as complete from a memory control unit and system perspective when a done tag corresponding to the read or write command is determined to have been received from each of the currently functioning channels 110. The tag checking mechanism in the MCU 106 may account for a permanently failed channel 110 by removing that channel 110 from a list of channels 110 to check in the tag tables. No read or write commands need to be retained in the MCU 106 for retrying commands, freeing up queuing resources within the MCU 106.

Figure 5:
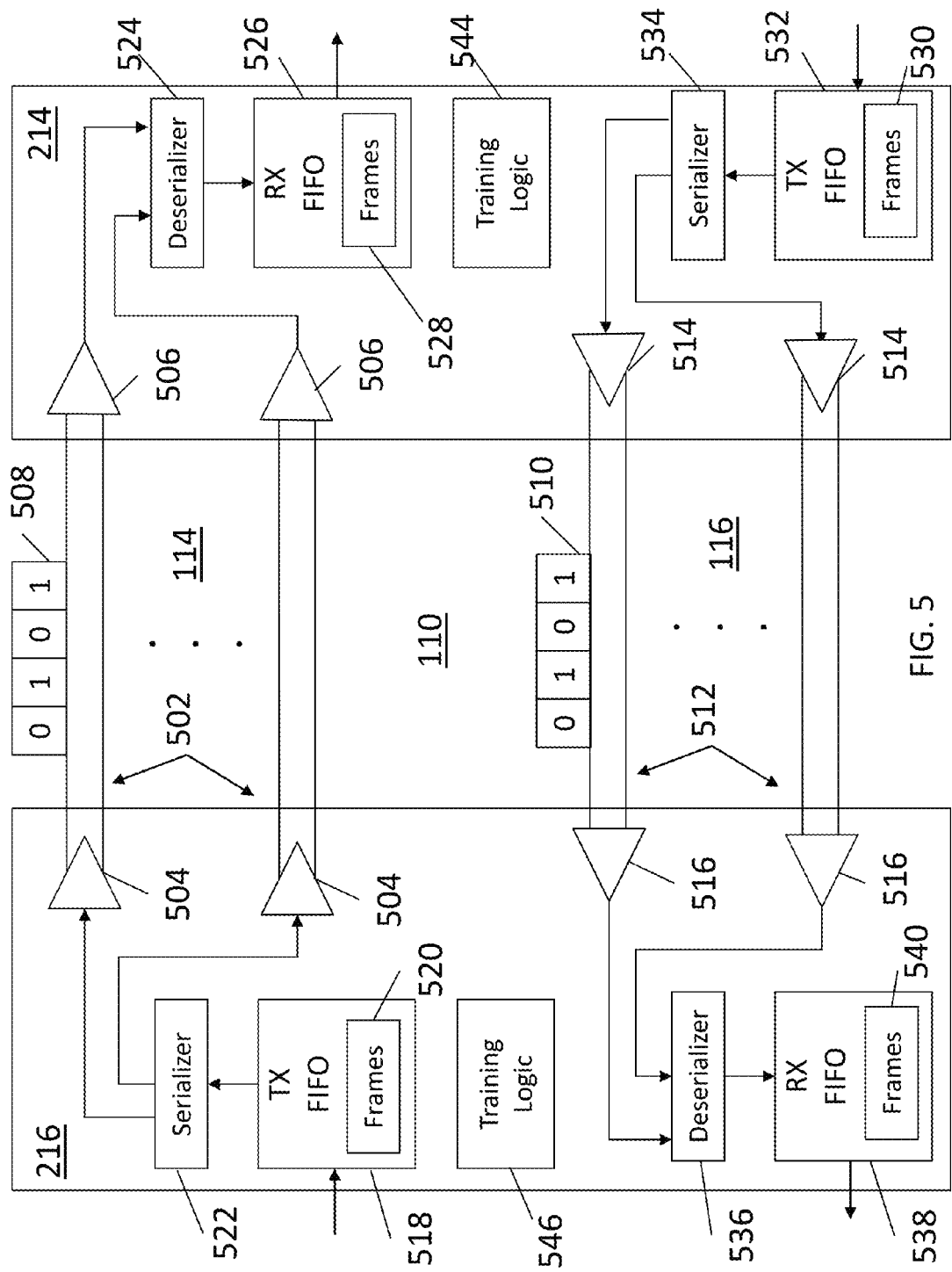
FIG. 5 depicts a memory subsystem channel and interfaces in accordance with an embodiment.

Timing and signal adjustments to support high-speed synchronous communications are also managed at the interface level for the channels 110. FIG. 5 depicts an example of channel 110 and interfaces 214 and 216 in greater detail in accordance with an embodiment. As previously described in reference to FIG. 1, each channel 110 includes a downstream bus 114 and an upstream bus 116. The downstream bus 114 includes multiple downstream lanes 502, where each lane 502 can be a differential serial signal path to establish communication between a driver buffer 504 of interface 216 and a receiver buffer 506 of interface 214. Similarly, the upstream bus 116 includes multiple upstream lanes 512, where each lane 512 can be a differential serial signal path to establish communication between a driver buffer 514 of interface 214 and a receiver buffer 516 of interface 216. In an exemplary embodiment, groups 508 of four bits are transmitted serially on each of the active transmitting lanes 502 per frame, and groups 510 of four bits are transmitted serially on each of the active transmitting lanes 512 per frame; however, other group sizes can be supported. The lanes 502 and 512 can be general data lanes, clock lanes, spare lanes, or other lane types, where a general data lane may send command, address, tag, frame control or data bits.

In interface 216, commands and/or data are stored in a transmit first-in-first-out (FIFO) buffer 518 to transmit as frames 520. The frames 520 are serialized by serializer 522 and transmitted by the driver buffers 504 as groups 508 of serial data on the lanes 502 to interface 214. In interface 214, serial data received at receiver buffers 506 are deserialized by deserializer 524 and captured in a receive FIFO buffer 526, where received frames 528 can be analyzed and reconstructed. When sending data from interface 214 back to interface 216, frames 530 to be transmitted are stored in a transmit FIFO buffer 532 of the interface 214, serialized by serializer 534, and transmitted by the driver buffers 514 as groups 510 of serial data on the lanes 512 to interface 216. In interface 216, serial data received at receiver buffers 516 are deserialized by deserializer 536 and captured in a receive FIFO buffer 538, where received frames 540 can be analyzed and reconstructed.

The interfaces 214 and 216 may each include respective instances of training logic 544 and 546 to configure the interfaces 214 and 216. The training logic 544 and 546 train both the downstream bus 114 and the upstream bus 116 to properly align a source synchronous clock to transmissions on the lanes 502 and 512. The training logic 544 and 546 also establish a sufficient data eye to ensure successful data capture.

Figure 6:
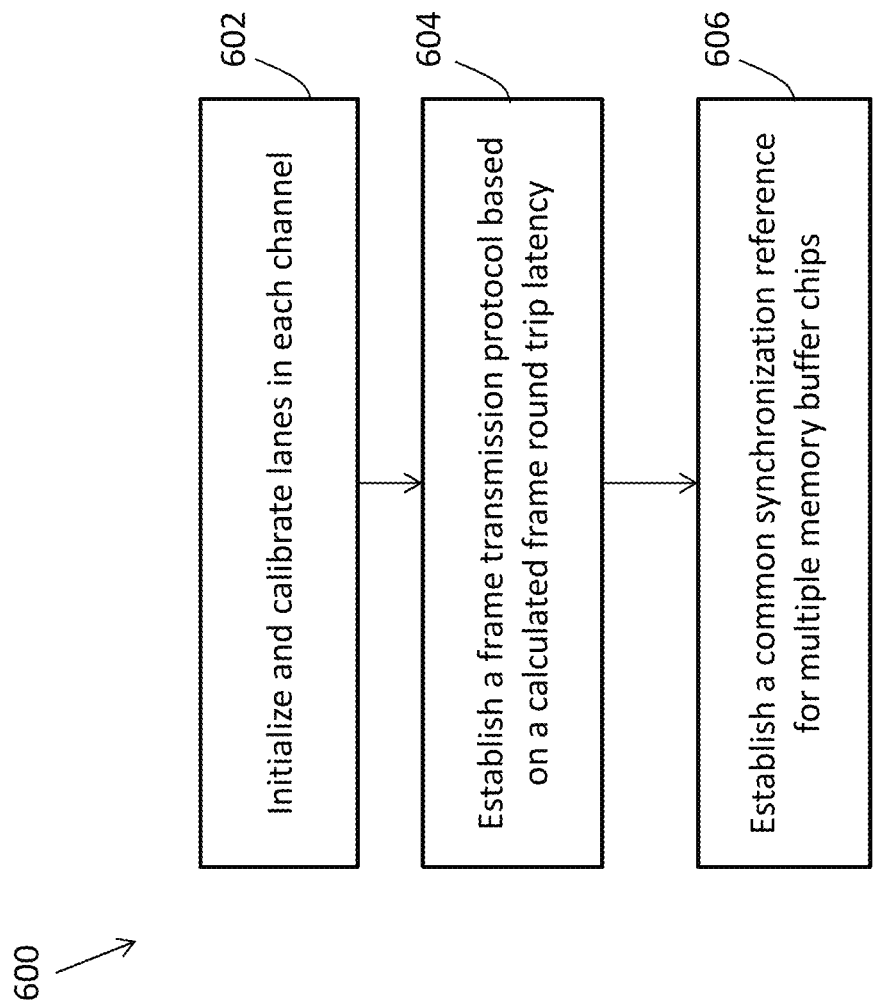
FIG. 6 depicts a process flow for providing synchronous operation in a memory subsystem in accordance with an embodiment.

Further details are described in reference to process 600 of FIG. 6.

FIG. 6 depicts a process 600 for providing synchronous operation in a memory subsystem in accordance with an embodiment. In order to accomplish high availability fully synchronous memory operation across all multiple channels 110, an initialization and synchronization process is employed across the channels 110. The process 600 is described in reference to elements of FIGS. 1-5.

At block 602, the lanes 502 and 512 of each channel 110 are initialized and calibrated. The training logic 544 and 546 can perform impedance calibration on the driver buffers 504 and 514. The training logic 544 and 546 may also perform static offset calibration of the receiver buffers 506 and 516 and/or sampling latches (not depicted) followed by a wire test to detect permanent defects in the transmission media of channel 110. Wire testing may be performed by sending a slow pattern that checks wire continuity of both sides of the clock and data lane differential pairs for the lanes 502 and 512. The wire testing may include driving a simple repeating pattern to set a phase rotator sampling point, synchronize the serializer 522 with the deserializer 524 and the serializer 534 with the deserializer 536, and perform lane-based deskewing. Data eye optimization may also be performed by sending a more complex training pattern that also acts as a functional data scrambling pattern.

Training logic 544 and 546 can use complex training patterns to optimize various parameters such as a final receiver offset, a final receiver gain, peaking amplitude, decision feedback equalization, final phase rotator adjustment, final offset calibration, scrambler and descrambler synchronization, and load-to-unload delay adjustments for FIFOs 518, 526, 532, and 538.

Upon detecting any non-functional lanes in the lanes 502 and 512, a dynamic sparing process is invoked to replace the non-functional/broken lane with an available spare lane of the corresponding downstream bus 114 or upstream bus 116. A final adjustment may be made to read data FIFO unload pointers of the receive FIFO buffers 526 and 538 to ensure sufficient timing margin.

At block 604, a frame transmission protocol is established based on a calculated frame round trip latency. Once a channel 110 is capable of reliably transmitting frames in both directions, a reference starting point is established for decoding frames. To establish synchronization with a common reference between the nest clock 405 and the master clock 408, a frame lock sequence is performed by the training logic 546 and 544. The training logic 546 may initiate the frame lock sequence by sending a frame including a fixed pattern, such as all ones, to the training logic 544 on the downstream bus 114. The training logic 544 locks on to the fixed pattern frame received on the downstream bus 114. The training logic 544 then sends the fixed pattern frame to the training logic 546 on the upstream bus 116. The training logic 546 locks on to the fixed pattern frame received on the upstream bus 116. The training logic 546 and 544 continuously generate the frame beats. Upon completion of the frame lock sequence, the detected frame start reference point is used as an alignment marker for all subsequent internal clock domains.

A positive acknowledgement frame protocol may be used where the training logic 544 and 546 acknowledge receipt of every frame back to the transmitting side. This can be accomplished through the use of sequential transaction identifiers assigned to every transmitted frame. In order for the sending side to accurately predict the returning acknowledgment, another training sequence referred to as frame round trip latency (FRTL) can be performed to account for the propagation delay in the transmission medium of the channel 110.

In an exemplary embodiment, the training logic 546 issues a null packet downstream and starts a downstream frame timer. The training logic 544 responds with an upstream acknowledge frame and simultaneously starts an upstream round-trip timer. The training logic 546 sets a downstream round-trip latency value, when the first upstream acknowledge frame is received from the training logic 544. The training logic 546 sends a downstream acknowledge frame on the downstream bus 114 in response to the upstream acknowledge frame from the training logic 544. The training logic 544 sets an upstream round-trip delay value when the downstream acknowledge frame is detected. The training logic 544 issues a second upstream acknowledge frame to close the loop. At this time the training logic 544 goes into a channel interlock state. The training logic 544 starts to issue idle frames until a positive acknowledgement is received for the first idle frame transmitted by the training logic 544. The training logic 546 detects the second upstream acknowledge frame and enters into a channel interlock state. The training logic 546 starts to issue idle frames until a positive acknowledgement is received for the first idle frame transmitted by the training logic 546. Upon receipt of the positive acknowledgement, the training logic 546 completes channel interlock and normal traffic is allowed to flow through the channel 110.

At block 606, a common synchronization reference is established for multiple memory buffer chips 202a-202n. In the case of a fully synchronous multi-channel structure, a relative synchronization point is established to ensure that operations initiated from the CP system 102 are executed in the same manner on the memory buffer chips 202a-202n, even when the memory buffer chips 202a-202n are also generating their own autonomous refresh and calibration operations. Synchronization can be accomplished by locking into a fixed frequency ratio between the nest and memory domains 220 and 224 within each memory buffer chip 202. In exemplary embodiments, the PLLs 404 and 406 from both the nest and memory domains 220 and 224 are interlocked such that they have a fixed repeating relationship. This ensures both domains have a same-edge aligned boundary (e.g., rising edge aligned) at repeated intervals, which is also aligned to underlying clocks used for the high speed source synchronous interface 214 as well as frame decode and execution logic of the MBU 218. A common rising edge across all the underlying clock domains is referred to as the alignment or "golden" reference cycle.

Multi-channel operational synchronization is achieved by using the alignment reference cycle to govern all execution and arbitration decisions within the memory buffer chips 202a-202n. Since all of the memory buffer chips 202a-202n in the same virtual channel 111 have the same relative alignment reference cycle, all of their queues and arbiters (not depicted) remain logically in lock step. This results in the same order of operations across all of the channels 110. Even though the channels 110 can have inherent physical skew, and each memory buffer chip 202 performs a given operation at different absolute times with respect to the other memory buffer chips 202, the common alignment reference cycle provides an opportunity for channel operations to transit the boundary layer 222 between the nest and memory domains 220 and 224 with guaranteed timing closure and equivalent arbitration among internally generated refresh and calibration operations.

As previously described in reference to FIG. 4, each memory buffer chip 202 includes two discrete PLLs, PLL 404 and PLL 406, for driving the underlying clocks 405 and 407 of the nest and memory domains 220 and 224. When operating in asynchronous mode, each PLL 404 and 406 has disparate reference clock inputs 408 and 414 with no inherent phase relationship to one another. However, when running in synchronous mode, the memory PLL 406 becomes a slave to the nest PLL 404 with the mode selector 420 taking over the role of providing a reference clock 418 to the memory PLL 406 such that memory domain clocks 407 align to the common alignment reference point. A common external reference clock, the master clock 408, may be distributed to the nest PLLs 404 of all memory buffer chips 202a-202n in the same virtual channel 111. The PLL 404 can be configured into an external feedback mode to ensure that all PLLs 404 align their output nest clocks 405 to a common memory sub-system reference point. This common point is used by dedicated sync logic to drive the appropriate reference clock 418 based on PLL 404 output 416 into the memory domain PLL 406 and achieve a lock onto the target alignment cycle (i.e., the "golden" cycle).

Figure 7:
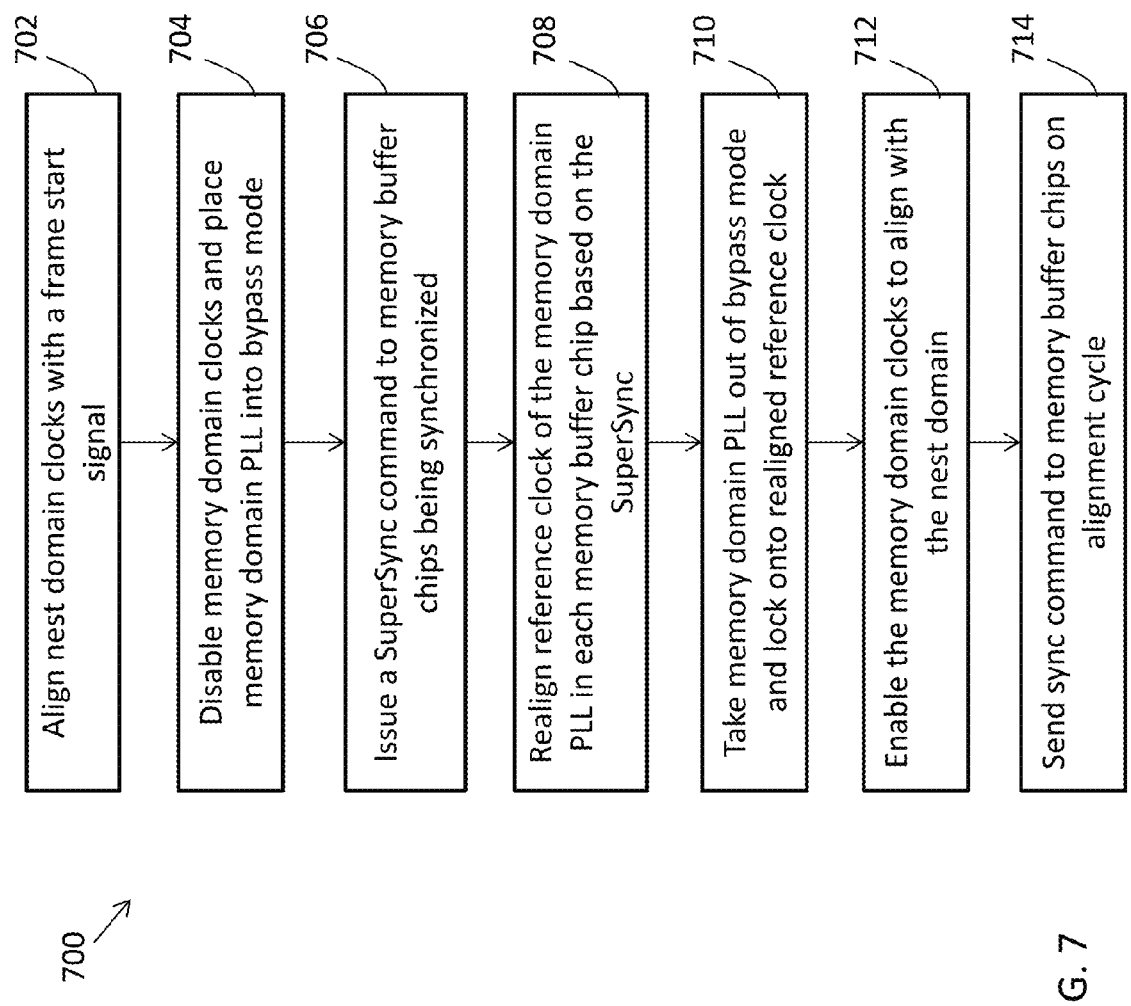
FIG. 7 depicts a process flow for establishing alignment between nest and memory domains in a memory subsystem in accordance with an embodiment.

FIG. 7 depicts a process 700 for establishing alignment between the nest and memory domains 220 and 224 in a memory subsystem 112 accordance with an embodiment. The process 700 is described in reference to elements of FIGS. 1-6. The process 700 establishes an alignment or "golden" cycle first in the nest domain 220 followed by the memory domain 224. All internal counters and timers of a memory buffer chip 202 are aligned to the alignment cycle by process 700.

At block 702, the nest domain clocks 405 are aligned with a frame start signal from a previous frame lock of block 604. The nest domain 220 can use multiple clock frequencies for the nest domain clocks 405, for example, to save power. A frame start may be defined using a higher speed clock, and as such, the possibility exists that the frame start could fall in a later phase of a slower-speed nest domain clock 405. This would create a situation where frame decoding would not be performed on an alignment cycle. In order to avoid this, the frame start signal may be delayed by one or more cycles, if necessary, such that it always aligns with the slower-speed nest domain clock 405, thereby edge aligning the frame start with the nest domain clocks 405. Clock alignment for the nest domain clocks 405 can be managed by the PLL 404 and/or additional circuitry (not depicted). At block 704, the memory domain clocks 407 are turned off and the memory domain PLL 406 is placed into bypass mode.

At block 706, the MCS 108 issues a super synchronize ("SuperSync") command using a normal frame protocol to all memory buffer chips 202a-202n. The MCS 108 may employ a modulo counter matching an established frequency ratio such that it will only issue any type of synchronization command at a fixed period. This establishes the master reference point for the entire memory subsystem 112 from the MCS 108 perspective. Even though the SuperSync command can arrive at the memory buffer chips 202a-202n at different absolute times, each memory buffer chip 202 can use a nest cycle upon which this command is decoded as an internal alignment cycle. Since skew among the memory buffer chips 202a-202n is fixed, the alignment cycle on each of the memory buffer chips 202a-202n will have the same fixed skew. This skew translates into a fixed operational skew under error free conditions.

At block 708, sync logic of the memory buffer chip 202, which may be part of the mode selector 420, uses the SuperSync decode as a reference to trigger realignment of the reference clock 418 that drives the memory domain PLL 406. The SuperSync decode is translated into a one cycle pulse signal 494, synchronous with the nest domain clock 405 that resets to zero a modulo counter 496 in the FSYNC block 492. The period of this counter 496 within the FSYNC block 492 is set to be the least common multiple of all memory and nest clock frequencies with the rising edge marking the sync-point corresponding to the reference point previously established by the MCS 108. The rising edge of FSYNC clock 416 becomes the reference clock of PLL 406 to create the memory domain clocks. By bringing the lower-frequency output of PLL 406 back into the external feedback port, the nest clock 405 and memory clock 407 all have a common clock edge aligned to the master reference point. Thus, the FSYNC block 492 provides synchronous clock alignment logic.

At block 710, the memory domain PLL 406 is taken out of bypass mode in order to lock into the new reference clock 418 based on the output 416 of the PLL 404 rather than reference clock 414. At block 712, the memory domain clocks 407 are turned back on. The memory domain clocks 407 are now edge aligned to the same alignment reference cycle as the nest domain clocks 405.

At block 714, a regular subsequent sync command is sent by the MCS 108 on the alignment cycle. This sync command may be used to reset the various counters, timers and MISRs 226 that govern internal memory operation command generation, execution and arbitration. By performing a reset on the alignment cycle, all of the memory buffer chips 202a-202n start their respective internal timers and counters with the same logical reference point. If an arbiter on one memory buffer chip 202 identifies a request from both a processor initiated memory operation and an internally initiated command on a particular alignment cycle, the corresponding arbiter on the remaining memory buffer chips 202 will also see the same requests on the same relative alignment cycle. Thus, all memory buffer chips 202a-202n will make the same arbitration decisions and maintain the same order of operations.

Embodiments may provide internally generated commands at memory buffer chip 202 to include DRAM refresh commands, DDR calibration operations, dynamic power management, error recovery, memory diagnostics, and the like. Anytime one of these operations is needed, it must cross into the nest domain 220 and go through the same arbitration as synchronous operations initiated by the MCS 108. Arbitration is performed on the golden cycle to ensure all the memory buffer chips 202 observe the same arbitration queues and generate the same result. The result is dispatched across boundary layer 222 on the golden cycle which ensures timing and process variations in each memory buffer chip 202 is nullified.

Under normal error free conditions, the order of operations will be maintained across all of the memory buffer chips 202a-202n. However, there are situations where one channel 110 can get out of sync with the other channels 110. One such occurrence is the presence of intermittent transmission errors on one or more of the interfaces 214 and 216. Exemplary embodiments include a hardware based recovery mechanism where all frames transmitted on a channel 110 are kept in a replay buffer for a prescribed period of time. This time covers a window long enough to guarantee that the frame has arrived at the receiving side, has been checked for errors, and a positive acknowledgement indicating error free transmission has been returned to the sender. Once this is confirmed, the frame is retired from the replay buffer. However, in the case of an erroneous transmission, the frame is automatically retransmitted, or replayed, along with a number of subsequent frames in case the error was a one-time event. In many cases, the replay is sufficient and normal operation can resume. In certain cases, the transmission medium of the channel 110 has become corrupted to the point that a dynamic repair is instituted to replace a defective lane with a spare lane from lanes 502 or 512. Upon completion of the repair procedure, the replay of the original frames is sent and again normal operation can resume.

Another less common occurrence can be an on-chip disturbance manifesting as a latch upset which results in an internal error within the memory buffer chip 202. This can lead to a situation where one memory buffer chip 202 executes its operations differently from the remaining memory buffer chips 202. Although the memory system 100 continues to operate correctly, there can be significant performance degradation if the channels 110 do not operate in step with each other. In exemplary embodiments, the MISRs 226 monitor for and detect such a situation. The MISRs 226 receive inputs derived from key timers and counters that govern the synchronous operation of the memory buffer chip 202, such as refresh starts, DDR calibration timers, power throttling, and the like. The inputs to the MISRs 226 are received as a combination of bits that collectively form a signature. One or more of the bits of the MISRs 226 are continually transmitted as part of an upstream frame payload to the MCU 106, which monitors the bits received from the MISRs 226 of the memory buffer chips 202a-202n. The presence of physical skew between the channels 110 results in the bits from the MISRs 226 arriving at different absolute times across the channels 110. Therefore, a learning process is incorporated to calibrate checking of the MISRs 226 to the wire delays in the channels 110.

In exemplary embodiments, MISR detection in the MCU 106 incorporates two distinct aspects in order to monitor the synchronicity of the channels 110. First, the MCU 106 monitors the MISR bits received on the upstream bus 116 from each of the memory buffer chips 202a-202n and any difference seen in the MISR bit stream indicates an out-of-sync condition. Although this does not pose any risk of a data integrity issue, it can negatively impact performance, as the MCU 106 may incur additional latency waiting for an entire cache line access to complete across the channels 110. Another aspect is monitoring transaction sequence identifiers (i.e., tags) associated with each memory operation and comparing associated "data" tags or "done" tags as the operations complete. Once again, skew of the channels 110 is taken into account in order to perform an accurate comparison. In one example, this skew can manifest in as many as 30 cycles of difference between the fastest and slowest channel 110. If the tags are 7-bits wide, with five channels 110, and a maximum 30-cycle difference across channels 110, this would typically require 5×7×30=1050 latches to perform a simplistic compare. There may be some cases that equate to about 40 bit-times which is about 4 cycles of deskew after aligning to a frame. To further reduce the number of latches, a MISR can be incorporated within the MCU 106 to encode the tag into a bit stream, which is then pipelined to eliminate the skew. By comparing the output of the MISR of the MCU 106 across all of the channels 110, a detected difference indicates an out-of-order processing condition.

In either of these situations, the afflicted channel 110 can at least temporarily operate out of sync or out of order with respect to the other channels 110. Continuous availability of the memory subsystem 112 may be provided through various recovery and self-healing mechanisms. Data tags can be used such that in the event of an out-of-order or out-of-sync condition, the MCU 106 continues to function. Each read command may include an associated data tag that allows the MCS 108 to handle data transfers received from different channels 110 at different times or even in different order. This allows proper functioning even in situations when the channels 110 go out of sync.

For out-of-sync conditions, a group of hierarchical MISRs 226 can be used accumulate a signature for any sync-related event. Examples of sync-related events include a memory refresh start, a periodic driver (ZQ) calibration start, periodic memory calibration start, power management window start, and other events that run off a synchronized counter. One or more bits from calibration timers, refresh timers, and the like can serve as inputs to the MISRs 226 to provide a time varying signature which may assist in verifying cross-channel synchronization at the MCU 106. Hierarchical MISRs 226 can be inserted wherever there is a need for speed matching of data. For example, speed matching may be needed between MBA 212a and the MBU 218, between the MBA 212b and the MBU 218, between the MBU 218 and the upstream bus 116, and between the interfaces 216a-216n and the MCS 108.

For out-of-order conditions, staging each of the tags received in frames from each channel 110 can be used to deskew the wire delays and compare them. A MISR per channel 110 can be used to create a signature bit stream from the tags received at the MCU 106 and perform tag/signature-based deskewing rather than hardware latch-based deskewing. Based on the previous example of 7-bit wide tags, with five channels 110, and a maximum 30-cycle difference across channels 110, the use of MISRs reduces the 1050 latches to about 7×5+30×5=185 latches, plus the additional support latches.

To minimize performance impacts, the MCS 108 tries to keep all channels 110 in lockstep, which implies that all commands are executed in the same order. When read commands are executed, an associated data tag is used to determine which data correspond to which command. This approach also allows the commands to be reordered based on resource availability or timing dependencies and to get better performance. Commands may be reordered while keeping all channels 110 in lockstep such that the reordering is the same across different channels 110. In this case, tags can be used to match the data to the requester of the data from memory regardless of the fact that the command order changed while the data request was processed.

Marking a channel 110 in error may be performed when transfers have already started and to wait for recovery for cases where transfers have not yet occurred. Data blocks from the memory subsystem 112 can be delivered to the cache subsystem interface 122 of FIG. 1 as soon as data is available without waiting for complete data error detection. This design implementation is based on the assumption that channel errors are rare. Data can be sent across clock domains from the MCS 108 to the cache subsystem interface 122 asynchronously as soon as it is available from all channels 110 but before data error detection is complete for all frames. If a data error is detected after the data block transfer has begun, an indication is sent from the MCS 108 to the cache subsystem interface 122, for instance, on a separate asynchronous interface, to intercept the data block transfer in progress and complete the transfer using redundant channel information. Timing requirements are enforced to ensure that the interception occurs in time to prevent propagation of corrupt data to the cache subsystem 118 of FIG. 1. A programmable count-down counter may be employed to enforce the timing requirements.

If the data error is detected before the block data transfer has begun to the cache subsystem 118, the transfer is stalled until all frames have been checked for any data errors. Assuming errors are infrequent, the performance impact is minimal. This reduces the use of channel redundancy and may result in avoidance of possible uncorrectable errors in the presence of previously existing errors in the DRAM devices 204.

The MCU 106 may also include configurable delay functions on a per-command type or destination basis to delay data block transfer to upstream elements, such as caches, until data error detection is completed for the block. Command or destination information is available for making such selections as inputs to the tag directory. This can selectively increase system reliability and simplify error handling, while minimizing performance impacts.

To support other synchronization issues, the MCU 106 can re-establish synchronization across multiple channels 110 in the event of a channel failure without having control of an underlying recovery mechanism used on the failed channel. A programmable quiesce sequence incrementally attempts to restore channel synchronization by stopping stores and other downstream commands over a programmable time interval. The quiesce sequence may wait for completion indications from the memory buffer chips 202a-202n and inject synchronization commands across all channels 110 to reset underlying counters, timers, MISRs 226, and other time-sensitive circuitry to the alignment reference cycle. If a failed channel 110 remains out of synchronization, the quiesce sequence can be retried under programmatic control. In many circumstances, the underlying root cause of the disturbance can be self healed, thereby resulting in the previously failed channel 110 being reactivated and resynchronized with the remaining channels 110. Under extreme error conditions the quiesce and recovery sequence fails to restore the failed channel 110, and the failed channel 110 is permanently taken off line. In a RAIM architecture that includes five channels 110, the failure of one channel 110 permits the remaining four channels 110 to operate with a reduced level of protection.

Figure 8:
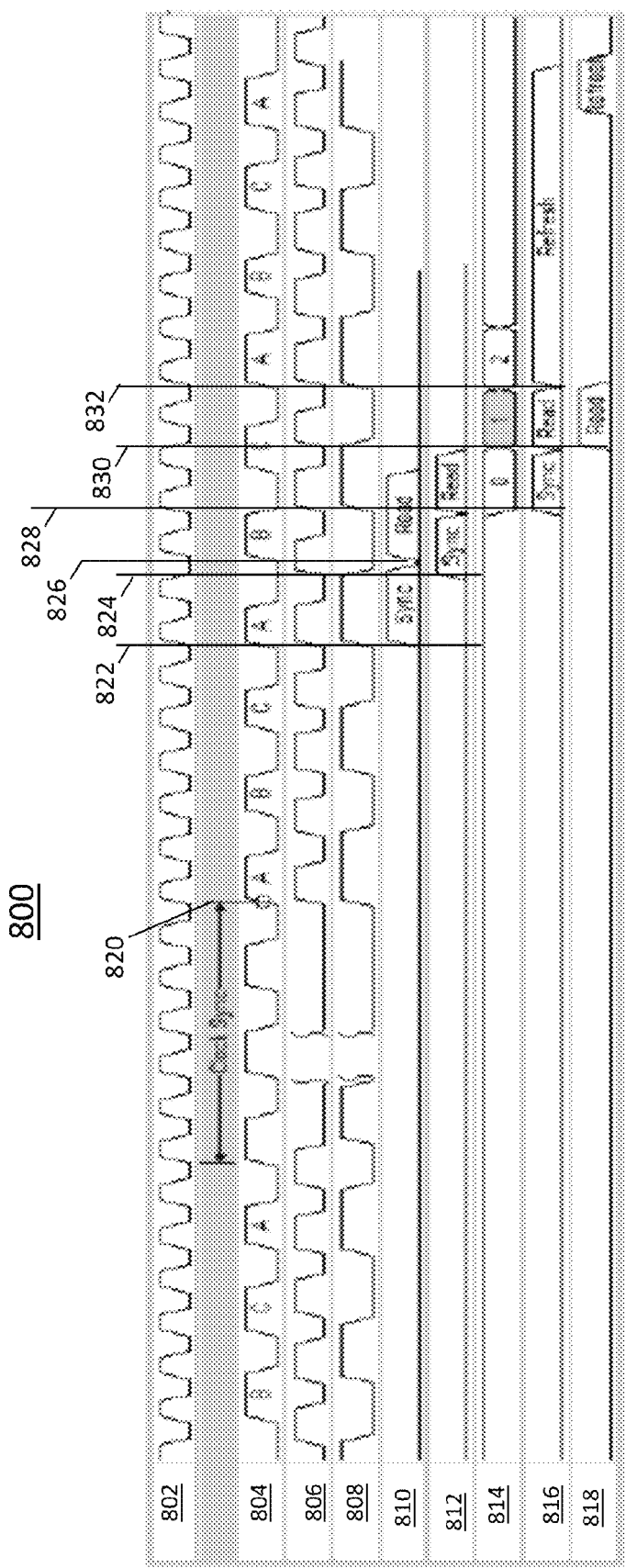
FIG. 8 depicts a timing diagram of synchronizing a memory subsystem in accordance with an embodiment.

FIG. 8 depicts an example timing diagram 800 of synchronizing a memory subsystem in accordance with an embodiment. The timing diagram 800 includes timing for a number of signals of the memory buffer chip 202. In the example of FIG. 8, two of the nest domain clocks 405 of FIG. 4 are depicted as a higher-speed nest domain clock frequency 802 and a lower-speed nest domain clock frequency 804. Two of the memory domain clocks 407 of FIG. 4 are depicted in FIG. 8 as a higher-speed memory domain clock frequency 806 and a lower-speed memory domain clock frequency 808. The timing diagram 800 also depicts example timing for a nest domain pipeline 810, a boundary layer 812, a reference counter 814, a memory queue 816, and a DDR interface 818 of a DDR port 210. In an embodiment, the higher-speed nest domain clock frequency 802 is about 2.4 GHz, the lower-speed nest domain clock frequency 804 is about 1.2 GHz, the higher-speed memory domain clock frequency 806 is about 1.6, GHz and the lower-speed memory domain clock frequency 808 is about 0.8 GHz.

A repeating pattern of clock cycles is depicted in FIG. 8 as a sequence of cycles "B", "C", "A" for the lower-speed nest domain clock frequency 804. Cycle A represents an alignment cycle, where other clocks and timers in the memory buffer chip 202 are reset to align with a rising edge of the alignment cycle A. Upon receiving a SuperSync command, the higher and lower-speed memory domain clock frequencies 806 and 808 stop and restart based on a sync point that results in alignment after a clock sync window 820. Once alignment is achieved, the alignment cycle A, also referred to as a "golden" cycle, serves as a common logical reference for all memory buffer chips 202a-202n in the same virtual channel 111. Commands and data only cross the boundary layer 222 on the alignment cycle. A regular sync command can be used to reset counters and timers within each of the memory buffer chips 202a-202n such that all counting is referenced to the alignment cycle.

In FIG. 8 at clock edge 822, the higher and lower-speed nest domain clock frequencies 802 and 804, the higher and lower-speed memory domain clock frequencies 806 and 808, and the nest domain pipeline 810 are all aligned. A sync command in the nest domain pipeline 810 is passed to the boundary layer 812 at clock edge 824 of the higher-speed memory domain clock frequency 806. At clock edge 826 of cycle B, a read command is received in the nest domain pipeline 810. At clock edge 828 of the higher-speed memory domain clock frequency 806, the read command is passed to the boundary layer 812, the reference counter 814 starts counting a zero, and the sync command is passed to the memory queue 816. At clock edge 830 of the higher-speed memory domain clock frequency 806, the reference counter 814 increments to one, the read command is passed to the memory queue 816 and the DDR interface 818. At clock edge 832 of the higher-speed memory domain clock frequency 806 which aligns with an alignment cycle A, the reference counter 814 increments to two, and a refresh command is queued in the memory queue 816. Alignment is achieved between clocks and signals of the nest domain 220 and the memory domain 224 for sending commands and data across the boundary layer 222 of FIG. 2.

As will be appreciated by one skilled in the art, one or more aspects of the present invention may be embodied as a system, method or computer program product. Accordingly, one or more aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system". Furthermore, one or more aspects of the present invention may take the form of a computer program product embodied in one or more computer readable medium(s) having computer readable program code embodied thereon.

Any combination of one or more computer readable medium(s) may be utilized. The computer readable medium may be a computer readable storage medium. A computer readable storage medium may be, for example, but not limited to, an electronic, magnetic, optical, electromagnetic, infrared or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

Figure 9:
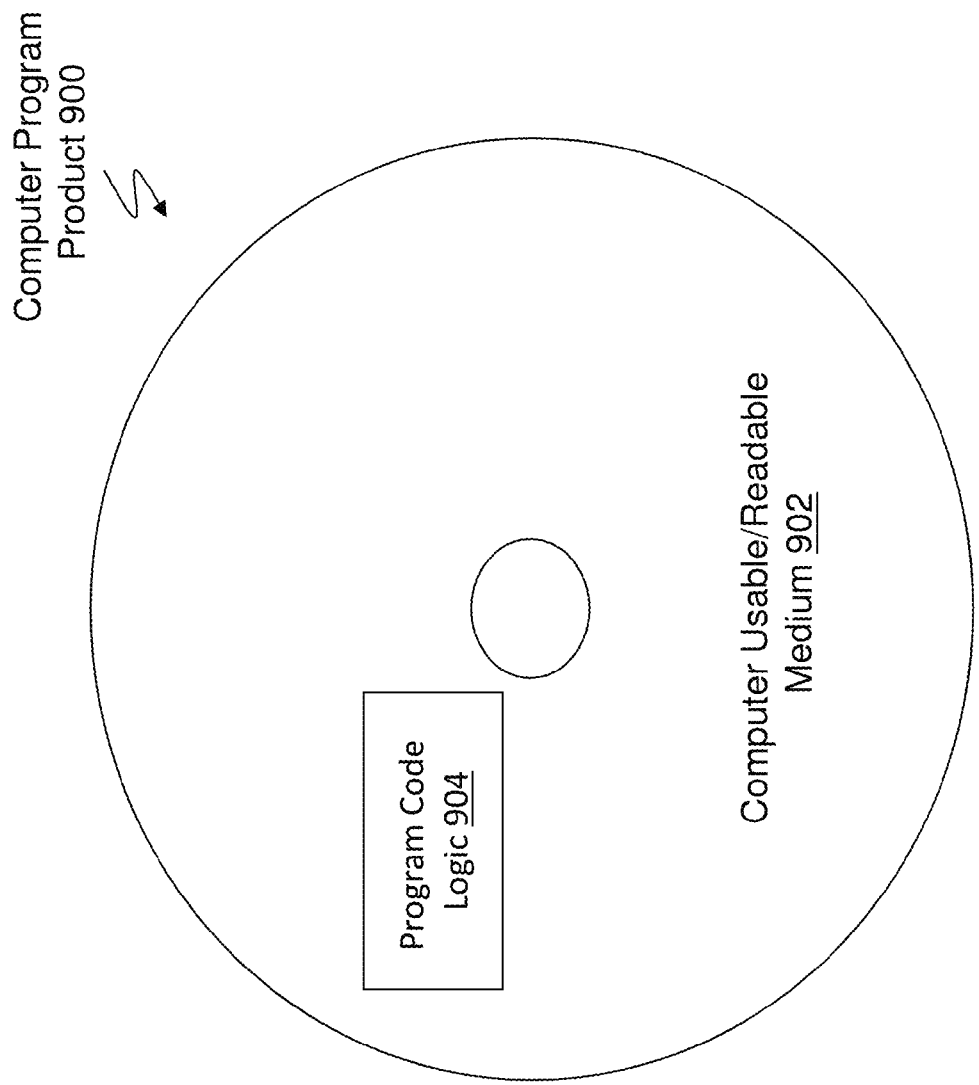
FIG. 9 illustrates a computer program product in accordance with an embodiment.

Referring now to FIG. 9, in one example, a computer program product 900 includes, for instance, one or more storage media 902, wherein the media may be tangible and/or non-transitory, to store computer readable program code means or logic 904 thereon to provide and facilitate one or more aspects of embodiments described herein.

Program code, when created and stored on a tangible medium (including but not limited to electronic memory modules (RAM), flash memory, Compact Discs (CDs), DVDs, Magnetic Tape and the like is often referred to as a "computer program product". The computer program product medium is typically readable by a processing circuit preferably in a computer system for execution by the processing circuit. Such program code may be created using a compiler or assembler for example, to assemble instructions, that, when executed perform aspects of the invention.

Technical effects and benefits include a configurable memory subsystem which can run in either an asynchronous or fully synchronous operational mode. Synchronizing communications between a processing subsystem and multiple memory buffer chips of a memory subsystem allows for high reliability memory systems to be designed using common memory buffer chips with a variety of configuration, synchronous, and asynchronous timing options including planar configurations and buffered DIMM configurations. A number of synchronization, alignment, error detection, and recovery features further enhance reliability and flexibility in exemplary embodiments.

The terminology used herein is for the purpose of describing particular embodiments only and is not intended to be limiting of embodiments. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of embodiments have been presented for purposes of illustration and description, but is not intended to be exhaustive or limited to the embodiments in the form disclosed. Many modifications and variations will be apparent to those of ordinary skill in the art without departing from the scope and spirit of the embodiments. The embodiments were chosen and described in order to best explain the principles and the practical application, and to enable others of ordinary skill in the art to understand the embodiments with various modifications as are suited to the particular use contemplated.

Computer program code for carrying out operations for aspects of the embodiments may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of embodiments are described above with reference to flowchart illustrations and/or schematic diagrams of methods, apparatus (systems) and computer program products according to embodiments. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various embodiments. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A computer system implemented method for dual asynchronous and synchronous memory operation in a memory subsystem, the method comprising:
   establishing a synchronous channel between a memory controller and a memory buffer chip;
   determining, by a mode selector, a reference clock source for a memory domain phase-locked loop of the memory buffer chip based on an operating mode of the memory buffer chip;
   providing an output of a nest domain phase-locked loop as the reference clock source to the memory domain phase-locked loop in the memory buffer chip based on the operating mode being synchronous, the nest domain phase-locked loop operable synchronous to a memory controller phase-locked loop of the memory controller; and
   providing a separate reference clock independent of the nest domain phase-locked loop as the reference clock to the memory domain phase-locked loop based on the operating mode being asynchronous.

2. The method of claim 1, further comprising:
   generating nest domain clocks based on the nest domain phase-locked loop;
   generating memory domain clocks based on the memory domain phase-locked loop;
   providing the nest domain clocks to a memory buffer unit in a nest domain of the memory buffer chip; and
   providing the memory domain clocks to a memory buffer adaptor configured to communicate with at least one memory interface port in a memory domain, the at least one memory interface port operable to access at least one memory device, wherein a boundary layer provides an interface between the nest domain and the memory domain.

3. The method of claim 1, wherein a plurality of additional memory buffer chips is coupled to the memory controller via a plurality of additional synchronous channels, the method further comprising:
   configuring the plurality of additional memory buffer chips to operate synchronously with the memory buffer chip and synchronously with respect to each other based on a common synchronization reference.

4. The method of claim 1, further comprising:
   aligning a memory domain clock edge of the memory domain phase-locked loop with a nest domain clock edge of the nest domain phase-locked loop based on an alignment cycle, the alignment cycle initiated by the memory controller.

5. The method of claim 4, further comprising:
   generating an internal reset within the memory buffer chip upon receiving a sync command from the memory controller on the alignment cycle.

6. The method of claim 4, wherein the nest domain phase-locked loop establishes a nest domain and the memory domain phase-locked loop establishes a memory domain, and the method further comprises:
   allowing commands and data to cross a boundary layer of the memory buffer chip between the nest domain and the memory domain on an alignment cycle while the operating mode is synchronous.

7. The method of claim 1, further comprising:
   initializing and calibrating lanes of the synchronous channel;
   calculating a frame round trip latency for the synchronous channel; and
   establishing a frame transmission protocol based on the calculated frame round trip latency.

8. A computer program product for synchronizing a dual asynchronous and synchronous memory subsystem, the computer program product comprising:
   a non-transitory storage medium readable by a processing circuit and storing instructions for execution by the processing circuit for performing a method comprising:
   initializing and calibrating lanes of a synchronous channel by a memory controller coupled to a memory buffer chip via the synchronous channel;
   calculating a frame round trip latency for the synchronous channel by the memory controller;
   establishing a frame transmission protocol based on the calculated frame round trip latency; and
   establishing a synchronization reference for the memory buffer chip by the memory controller, the memory buffer chip including a synchronous operating mode and an asynchronous operating mode relative to the memory controller.

9. The computer program product of claim 8, wherein the initializing and calibrating lanes of the synchronous channel further comprises:

performing impedance calibration on driver buffers of the synchronous channel; and performing wire testing of the lanes of the synchronous channel.

10. The computer program product of claim 8, wherein the synchronous channel comprises an upstream bus and a downstream bus, and further comprising:

sending a frame including a fixed pattern on the downstream bus to the memory buffer chip;

receiving the fixed pattern on the upstream bus from the memory buffer chip based on the memory buffer chip locking onto the fixed pattern on the downstream bus; and locking onto the fixed pattern on the upstream bus.

11. The computer program product of claim 8, wherein calculating the frame round trip latency for the synchronous channel further comprises:

issuing a null packet from the memory controller to the memory buffer device;

starting a downstream timer;

receiving an upstream acknowledge frame from the memory buffer device based on the memory buffer device receiving the null packet; and setting a downstream round-trip latency value based on receiving the upstream acknowledge frame.

12. The computer program product of claim 8, wherein a plurality of additional memory buffer chips is coupled to the memory controller via a plurality of additional synchronous channels, and further comprising:

issuing a sync command to the memory buffer chip and the additional memory buffer chips to establish an alignment cycle for the memory buffer chip and the additional memory buffer chips to align respective memory domains with nest domains;

issuing a subsequent sync command on the alignment cycle to generate an internal reset within the memory buffer chip and the additional memory buffer chips; and monitoring data returned from the memory buffer chip and the additional memory buffer chips for error conditions, out-of-sync conditions, and out-of-order conditions.

* * * * *